United States Patent
Nakayama et al.

(10) Patent No.: US 11,815,472 B2
(45) Date of Patent: Nov. 14, 2023

(54) INSPECTION SYSTEM AND INSPECTION METHOD

(71) Applicant: NEC Corporation, Tokyo (JP)

(72) Inventors: Naoya Nakayama, Tokyo (JP); Masanori Sekido, Tokyo (JP); Shinichi Morimoto, Tokyo (JP); Masayuki Ariyoshi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/690,277

(22) Filed: Mar. 9, 2022

(65) Prior Publication Data
US 2022/0299450 A1 Sep. 22, 2022

(30) Foreign Application Priority Data
Mar. 19, 2021 (JP) ................. 2021-045903

(51) Int. Cl.
*G01R 27/04* (2006.01)
*G01R 27/32* (2006.01)
*G01N 22/00* (2006.01)
*G01R 27/28* (2006.01)
*G01R 27/06* (2006.01)
G01N 22/04 (2006.01)
G01N 21/3581 (2014.01)

(52) U.S. Cl.
CPC ............. *G01N 22/00* (2013.01); *G01R 27/04* (2013.01); *G01R 27/06* (2013.01); *G01R 27/28* (2013.01); *G01N 21/3581* (2013.01); *G01N 22/04* (2013.01); *G01N 2223/639* (2013.01)

(58) Field of Classification Search
CPC ............. G01N 22/00; G01N 2223/639; G01N 21/3581; G01N 22/04; G01S 13/88; G01V 8/005; G01R 27/28; G01R 27/04; G01R 27/06
USPC ... 324/76.11–76.83, 459, 600, 629, 637, 639
See application file for complete search history.

(56) References Cited

U.S. PATENT DOCUMENTS

| | | | |
|---|---|---|---|
| 2005/0110672 A1* | 5/2005 | Cardiasmenos | G01N 21/3581 250/330 |
| 2008/0116374 A1* | 5/2008 | Ouchi | G01S 13/887 250/306 |
| 2008/0251733 A1* | 10/2008 | Anderton | G01V 8/005 250/394 |
| 2010/0141502 A1* | 6/2010 | Cardiasmenos | G01N 22/00 342/22 |

(Continued)

FOREIGN PATENT DOCUMENTS

| | | |
|---|---|---|
| JP | 2019144933 A | 8/2019 |
| JP | 2020204513 A | 12/2020 |

*Primary Examiner* — Raul J Rios Russo
(74) *Attorney, Agent, or Firm* — Sughrue Mion, PLLC

(57) ABSTRACT

To shorten a waiting time for a belongings inspection, the present invention provides an inspection system 10 including: an electromagnetic wave transmission/reception unit 11 that irradiates an electromagnetic wave having a wavelength of equal to or more than 30 micrometers and equal to or less than one meter, and receives a reflection wave; a detection unit 12 that performs detection processing, based on a signal of the reflection wave; a decision unit 13 that decides a path in which an inspection target person advances, based on a result of the detection processing; and a guide unit 14 that performs processing of guiding the inspection target person to a decided path.

13 Claims, 10 Drawing Sheets

(56) References Cited

U.S. PATENT DOCUMENTS

2020/0393594 A1* 12/2020 Obata ................. G06T 7/70
2021/0364425 A1* 11/2021 Iio ..................... G01V 8/005

* cited by examiner

FIG. 8

LIST OF INSPECTION TARGET PERSONS SUBJECTED TO
SECONDARY INSPECTION LATER

| IDENTIFICATION INFORMATION ABOUT SEAT | DETECTION TARGET OBJECT BEING DETECTED |
|---|---|
| 3-M-117 | PLASTIC BOTTLE, · · · |
| ⋮ | ⋮ |

FIG. 10

LIST OF INSPECTION TARGET PERSONS SUBJECTED TO SECONDARY INSPECTION LATER

| APPEARANCE INFORMATION | | DETECTION TARGET OBJECT BEING DETECTED |
|---|---|---|
| IMAGE | FEATURE VALUE | |
| P1721.jpg | *** | PLASTIC BOTTLE, ... |
| ... | ... | ... |

INSPECTION SYSTEM AND INSPECTION METHOD

TECHNICAL FIELD

The present invention relates to a detection system, an inspection system, and an inspection method.

BACKGROUND ART

A technique related to the present invention is disclosed in Patent Document 1 (Japanese Patent Application Publication No. 2020-204513) and Patent Document 2 (Japanese Patent Application Publication No. 2019-144933).

Patent Document 1 discloses a technique for inspecting belongings by using an electrical wave having at least a wave of a wavelength between one millimeter to 30 millimeters, the technique detecting a suspicious person having a dangerous object by primary screening that roughly inspects a large number of persons together, and performing a detailed inspection on the detected suspicious person by secondary screening.

Patent Document 2 discloses a technique for capturing a face image of a purchaser at a time of issue of a ticket, registering, in advance, authentication information based on the face image and information indicating a purchased seat in association with each other, and authenticating a person sitting in each seat by using an image in which a person sitting in each seat at a venue is captured and the authentication information described above being registered in advance.

SUMMARY

A belongings inspection is performed at various places for maintenance of safety and the like. Shortening of a waiting time is expected from a belongings inspection.

The present invention has a challenge to shorten a waiting time for a belongings inspection by an unprecedented method.

The present invention provides an inspection system including:
  an electromagnetic wave transmission/reception means for irradiating an electromagnetic wave having a wavelength of equal to or more than 30 micrometers and equal to or less than one meter, and receiving a reflection wave;
  a detection means for performing detection processing, based on a signal of the reflection wave;
  a decision means for deciding a path in which an inspection target person advances, based on a result of the detection processing; and
  a guide means for performing processing of guiding the inspection target person to a decided path.

Further, the present invention provides an inspection method including:
  by a computer,
  irradiating an electromagnetic wave having a wavelength of equal to or more than 30 micrometers and equal to or less than one meter, and receiving a reflection wave;
  performing detection processing, based on a signal of the reflection wave;
  deciding a path in which an inspection target person advances, based on a result of the detection processing; and
  performing processing of guiding the inspection target person to a decided path.

The present invention is able to shorten a waiting time for a belongings inspection.

BRIEF DESCRIPTION OF THE DRAWINGS

FIG. 8 is a diagram schematically illustrating one example of information processed by the inspection system according to the present example embodiment.

FIG. 10 is a diagram schematically illustrating one example of information processed by the inspection system according to the present example embodiment.

DESCRIPTION OF EMBODIMENTS

Hereinafter, example embodiments of the present invention will be described with reference to the drawings. Note that, in all of the drawings, a similar component has a similar reference sign, and description thereof will be appropriately omitted.

First Example Embodiment

"Outline"

Figure 1:
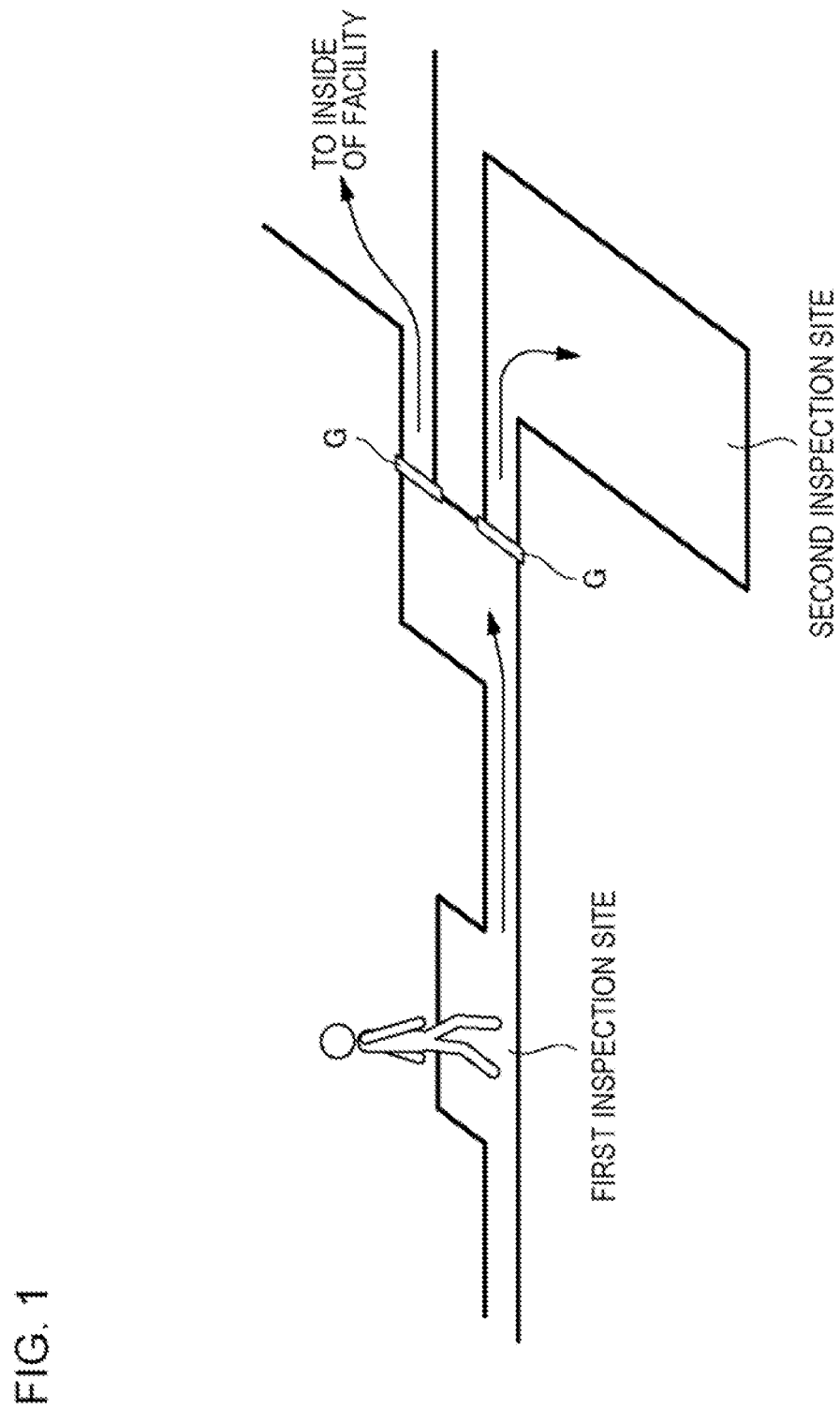
FIG. 1 is a diagram illustrating one example of a usage scene of an inspection system according to the present example embodiment.

First, an outline of an inspection system according to the present example embodiment will be described by using FIG. 1. The inspection system is used in any facility that requires a belongings inspection. As the facility, a building, a company, an amusement facility, an airport, a station, and the like are exemplified, which are not limited thereto.

The inspection system first performs a belongings inspection at a first inspection site. Then, the inspection system decides a path in which an inspection target person advances after the first inspection site, based on a result of the belongings inspection, and guides the inspection target person to the decided path.

For an inspection target person from which a detection target object is not detected, the inspection system decides a path different from a path leading to a secondary inspection, for example, a path leading to the inside of a facility.

On the other hand, for an inspection target person from which a detection target object is detected, the inspection system decides whether to perform the secondary inspection at a place (a second inspection site close to the first inspection site) or perform the secondary inspection later, depending on a type of the detection target object being detected, and decides a path in response to the decided content. For example, for an inspection target person from which a detection target object (for example: a gun, a knife, and the like) having a high degree of urgency is detected, the inspection system decides that the secondary inspection is performed at that place, and decides a path leading to the second inspection site. On the other hand, for an inspection target person from which a detection target object (for example: a plastic bottle, and the like) having a low degree of urgency is detected, the inspection system decides that the secondary inspection is performed later, and decides a path different from a path leading to the secondary inspection, for example, a path leading to the inside of a facility.

In this way, the inspection system for deciding a path in which an inspection target person advances after the first inspection site, based on a result of a belongings inspection at the first inspection site, and guiding the inspection target person to the decided path can appropriately and efficiently guide the inspection target person to the path after the first inspection site. As a result, an operation at the first inspection site can be made more efficient, and a waiting time for an inspection at the first inspection site can be shortened.

Further, the inspection system capable of sorting an inspection target person into the secondary inspection performed at that place (second inspection site) and the secondary inspection performed later, depending on a type of a detection target object being detected, instead of performing the secondary inspection at that place on all inspection target persons from which a detection target object is detected, can reduce congestion of the secondary inspection at that place. As a result, a waiting time for an inspection at the second inspection site can be shortened.

"Hardware Configuration"

Figure 2:
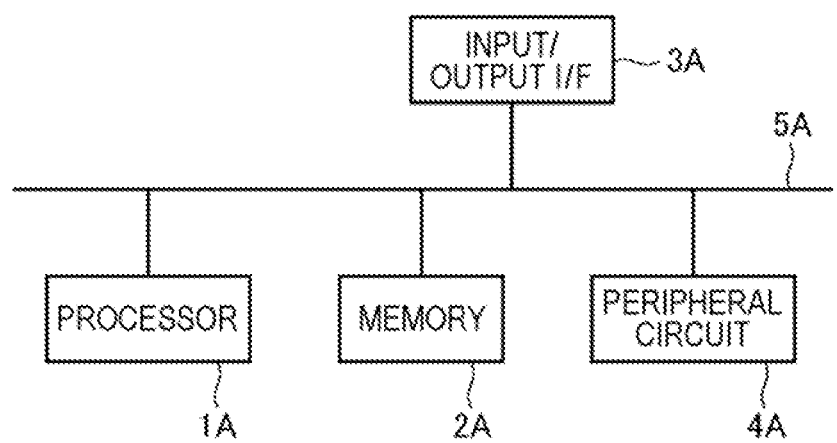
FIG. 2 is a diagram illustrating one example of a hardware configuration of the inspection system according to the present example embodiment.

Next, one example of a hardware configuration of the inspection system will be described. FIG. 2 is a diagram illustrating a hardware configuration example of the inspection system. Each functional unit included in the inspection system is achieved by any combination of hardware and software concentrating on as a central processing unit (CPU) of any computer, a memory, a program loaded into the memory, a storage unit such as a hard disc that stores the program (that can also store a program downloaded from a storage medium such as a compact disc (CD), a server on the Internet, and the like in addition to a program previously stored at a stage of shipping of an apparatus), and a network connection interface. Then, various modification examples of an achievement method and an apparatus thereof are understood by a person skilled in the art.

As illustrated in FIG. 2, the inspection system includes a processor 1A, a memory 2A, an input/output interface 3A, a peripheral circuit 4A, and a bus 5A. Various modules are included in the peripheral circuit 4A. The inspection system may not include the peripheral circuit 4A. Note that, the inspection system may be formed of a plurality of apparatuses separated physically and/or logically, or may be formed of one apparatus integrated physically and logically. When each apparatus is formed of a plurality of apparatuses separated physically and/or logically, each of the plurality of apparatuses can include the hardware configuration described above.

The bus 5A is a data transmission path for the processor 1A, the memory 2A, the peripheral circuit 4A, and the input/output interface 3A to transmit and receive data to and from one another. The processor 1A is an arithmetic processing apparatus such as a CPU and a graphics processing unit (GPU), for example. The memory 2A is a memory such as a random access memory (RAM) and a read only memory (ROM), for example. The input/output interface 3A includes an interface for acquiring information from an input apparatus, an external apparatus, an external server, an external sensor, an electromagnetic wave transmission/reception apparatus, and the like, an interface for outputting information to an output apparatus, an external apparatus, an external server, an electromagnetic wave transmission/reception apparatus, and the like, and the like. The input apparatus is, for example, a keyboard, a mouse, a microphone, and the like. The output apparatus is, for example, a display, a speaker, a printer, a mailer, and the like. The processor 1A can output an instruction to each of modules, and perform an arithmetic operation, based on an arithmetic result of the modules.

"Functional Configuration"

Figure 3:
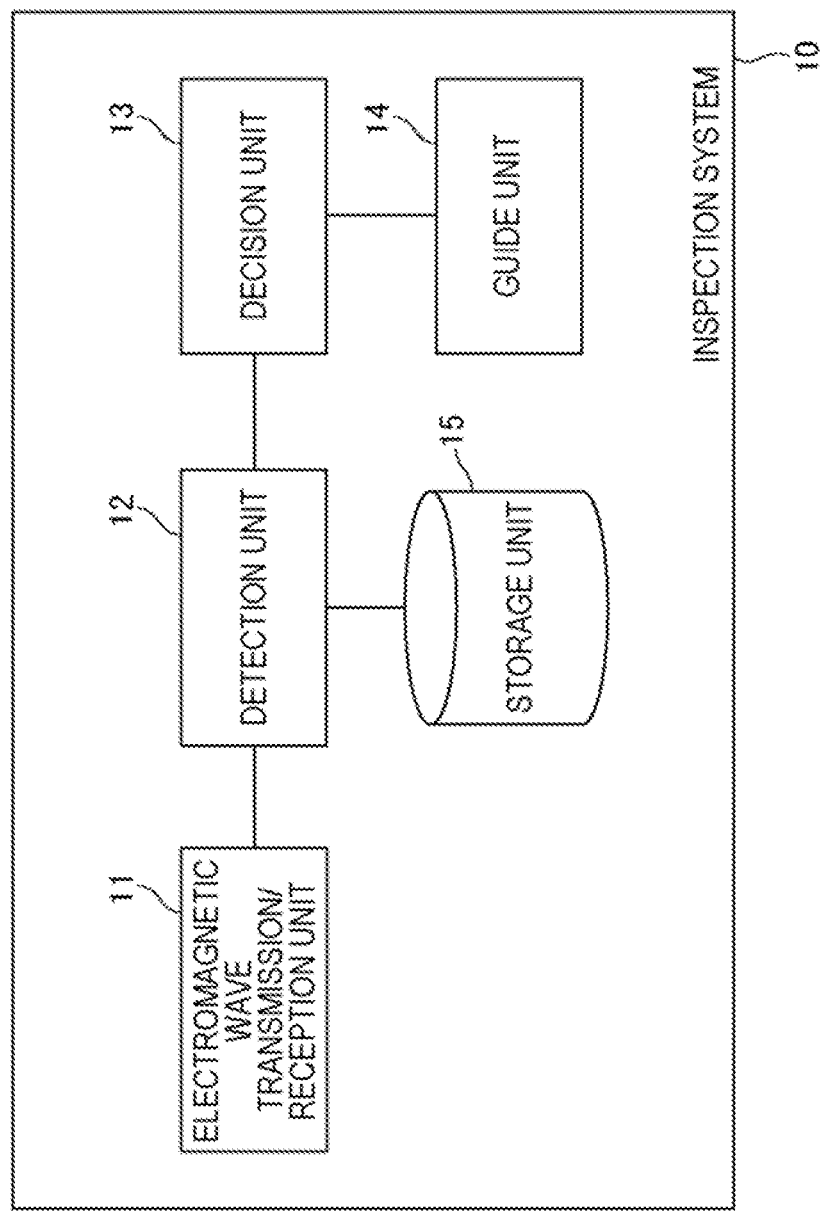
FIG. 3 is a diagram illustrating one example of a functional block diagram of the inspection system according to the present example embodiment.

Next, a functional configuration of the inspection system will be described. FIG. 3 illustrates one example of a functional block diagram of an inspection system 10. As illustrated, the inspection system 10 includes an electromagnetic wave transmission/reception unit 11, a detection unit 12, a decision unit 13, a guide unit 14, and a storage unit 15.

The electromagnetic wave transmission/reception unit 11 irradiates an electromagnetic wave (for example: a microwave, a millimeter wave, a terahertz wave, and the like) having a wavelength of equal to or more than 30 micrometers and equal to or less than one meter toward a person present in a predetermined region, and receives a reflection wave. The electromagnetic wave transmission/reception unit 11 is, for example, a radar. The electromagnetic wave transmission/reception unit 11 can be formed by adopting various techniques. For example, as in an example in FIG. 4, the electromagnetic wave transmission/reception unit 11 may be a sensor panel formed of a radar in which a plurality of antenna elements are aligned. Note that, a panel is one example, and the electromagnetic wave transmission/reception unit 11 may be formed by another technique such as a gate through which a person passes, and a booth that a person enters.

The detection unit 12 performs detection processing of detecting an abnormal state, based on a signal of a reflection wave being received by the electromagnetic wave transmission/reception unit 11. The abnormal state in the present example embodiment is a state where a person present in a predetermined region carries a preset detection target object. The detection target object is, for example, an object prohibited from being brought, and a gun, a knife, a camera, a plastic bottle, and the like are exemplified, which are not limited thereto. Hereinafter, one example of determination processing by the detection unit 12 will be described.

First Processing Example

In the example, the detection unit 12 creates a transmission image, based on a signal of a reflection wave being received by the electromagnetic wave transmission/reception unit 11. Then, the detection unit 12 detects a detection target object from the transmission image, based on a shape of an object appearing in the transmission image. When the detection target object is detected from the transmission image, it is determined that a person present in a predetermined region carries the detection target object being detected.

A feature value of a shape of each of a plurality of detection target objects is generated by an advance preparation, and is stored in the storage unit 15. The detection unit 12 detects a detection target object from a transmission image, based on a comparison result between a feature value of a shape of the detection target object stored in the storage unit 15 and a feature value of a shape appearing in the transmission image. The processing by the detection unit 12 may be achieved by using an estimation model generated by machine learning based on training data formed of a transmission image and a label of a plurality of objects, or may be achieved by template matching.

Second Processing Example

In the example, the detection unit 12 determines whether a person present in a predetermined region carries a preset detection target object, based on a feature value (reflection wave feature value) appearing in a signal of a reflection wave being received by the electromagnetic wave transmission/reception unit 11. When a reflection wave feature value peculiar to a detection target object is detected from a signal of a reflection wave, it is determined that a person present in a predetermined region carries the detection target object being detected.

A reflection wave feature value of each of a plurality of objects is generated by an advance preparation, and is stored in the storage unit 15. The detection unit 12 detects a reflection wave feature value peculiar to a detection target object from a signal of a reflection wave, based on a comparison result between a reflection wave feature value of the detection target object stored in the storage unit 15 and a feature value appearing in the signal of the reflection wave. The processing by the detection unit 12 may be achieved by using an estimation model generated by machine learning based on training data formed of a signal of a reflection wave and a label of a plurality of objects, or may be achieved by template matching.

The decision unit 13 decides a path in which an inspection target person advances, based on a detection result by the detection unit 12.

For an inspection target person from which an abnormal state is not detected, i.e., an inspection target person from which a detection target object is not detected, the decision unit 13 decides a path (another path) different from a path leading to the secondary inspection, for example, a path leading to the inside of a facility.

On the other hand, for an inspection target person from which an abnormal state is detected, i.e., an inspection target person from which a detection target object is detected, the decision unit 13 decides whether to perform the secondary inspection at a place or perform the secondary inspection later, depending on a type of the detection target object being detected, and decides a path in response to the decided content. For example, for an inspection target person from which a detection target object (for example: a gun, a knife, and the like) having a high degree of urgency is detected, the decision unit 13 decides that the secondary inspection is performed at that place, and decides a path (first path) leading to the second inspection site. On the other hand, for an inspection target person from which a detection target object (for example: a plastic bottle, and the like) having a low degree of urgency is detected, the decision unit 13 decides that the secondary inspection is performed later, and decides a path (another path) different from a path leading to the secondary inspection, for example, a path leading to the inside of a facility.

Figure 5:
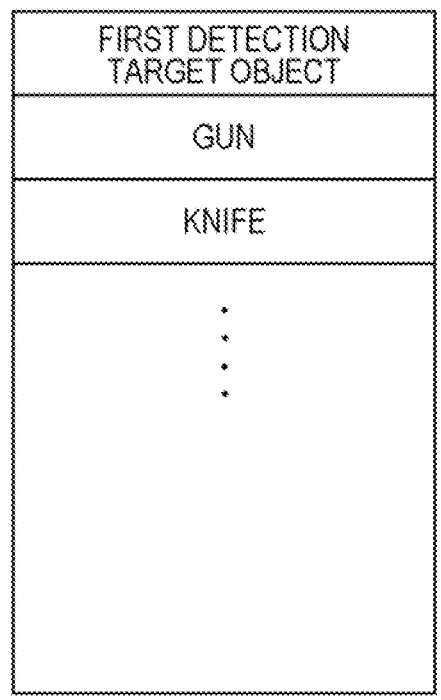
FIG. 5 is a diagram schematically illustrating one example of information processed by the inspection system according to the present example embodiment.

In the present example embodiment, as illustrated in FIG. 5, at least a part of a detectable detection target object is registered as a first detection target object. For example, a detection target object having a high degree of urgency is registered as the first detection target object. Then, the decision unit 13 decides that the secondary inspection is performed at that place, for an inspection target person from which the first detection target object is detected, and decides that the secondary inspection is performed later, for an inspection target person from which a detection target object that does not correspond to the first detection target object is detected. The information as illustrated in FIG. 5 is stored in advance in the storage unit 15.

The secondary inspection is an inspection different from a primary inspection performed at the first inspection site. A more detailed inspection is performed on an inspection target person determined to carry a detection target object in the primary inspection. The secondary inspection may be, for example, a belongings inspection by a visual inspection, a body touch, and the like by a person in charge, or may be another inspection.

Figure 4:
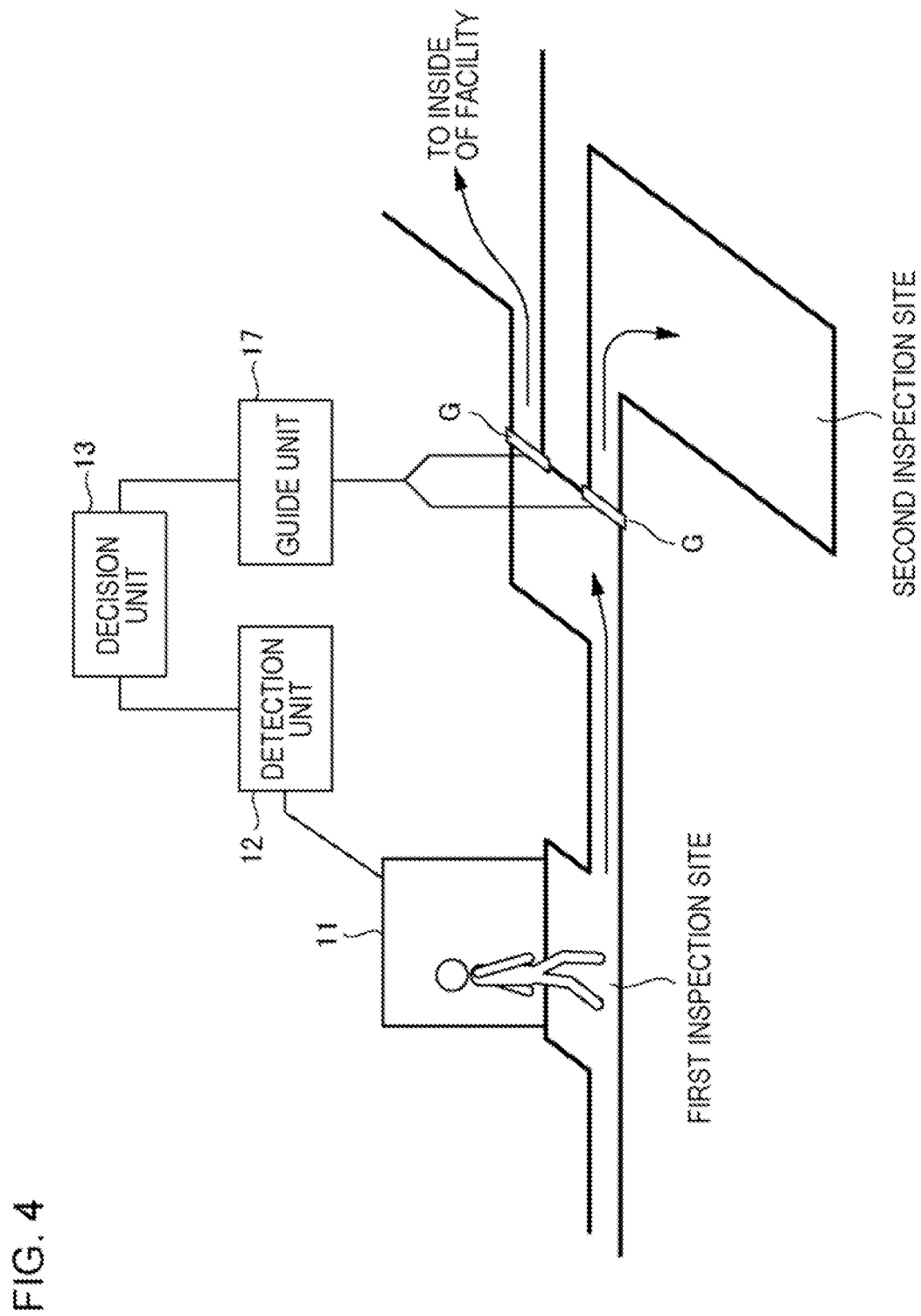
FIG. 4 is a diagram schematically illustrating one example of an electromagnetic wave transmission/reception unit according to the present example embodiment.

The guide unit 14 performs processing of guiding an inspection target person to a decided path. For example, as illustrated in FIG. 4, a gate G may be installed on each of a plurality of paths. Then, the guide unit 14 may perform processing of opening the gate G on a path in which the inspection target person advances, and closing the gate G on another path.

Further, the guide unit 14 may perform processing of notifying a predetermined person of a path in which an inspection target person advances in addition to or instead of control of the gate G. The notification is achieved via various output apparatuses such as a display, a speaker, a lamp, and a projection apparatus installed at an inspection site. The notified person may be an inspection target person, may be a person who is present at an inspection site and takes charge of managing an inspection, or may be both.

Figure 6:
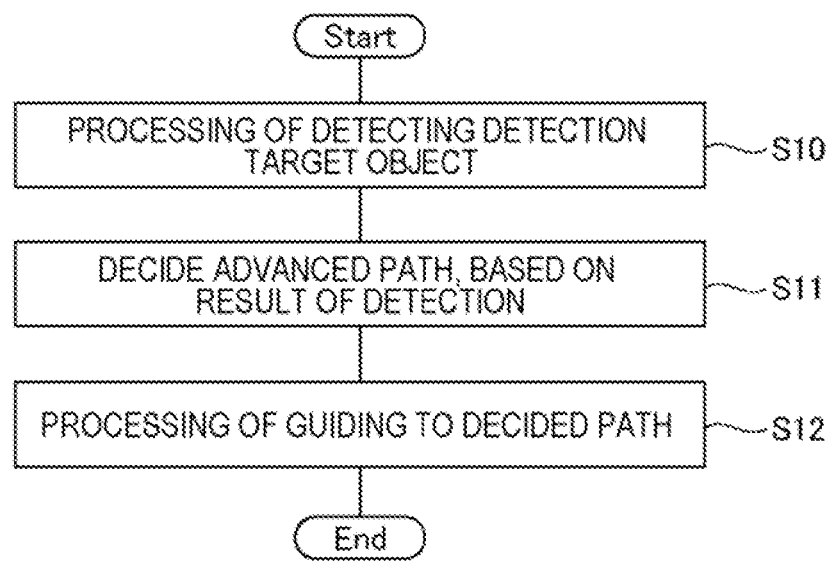
FIG. 6 is a flowchart illustrating one example of a flow of the processing of the inspection system according to the present example embodiment.

Next, one example of a flow of processing of the inspection system 10 will be described by using a flowchart in FIG. 6.

First, the inspection system 10 performs processing of detecting a detection target object from an inspection target person (S10).

Specifically, the inspection system 10 irradiates an inspection target person with an electromagnetic wave having a wavelength of equal to or more than 30 micrometers and equal to or less than one meter, and receives a reflection wave. Then, the inspection system 10 performs the processing of detecting a detection target object, based on a signal of the reflection wave.

Next, the inspection system 10 decides a path in which the inspection target person advances, based on a detection result in S10 (S11).

Specifically, for an inspection target person from which a detection target object is not detected, the inspection system 10 decides a path different from a path leading to the secondary inspection, for example, a path leading to the inside of a facility.

Further, for an inspection target person from which the first detection target object (see FIG. 5) being predefined is detected, the inspection system 10 decides that the secondary inspection is performed at that place, and decides a path leading to the second inspection site.

Further, for an inspection target person from which a detection target object different from the first detection target object (see FIG. 5) is detected, the inspection system 10 decides that the secondary inspection is performed later, and decides a path different from a path leading to the secondary inspection, for example, a path leading to the inside of a facility.

Next, the inspection system 10 performs processing of guiding the inspection target person to the path decided in S11 (S12).

Specifically, opening and closing of a gate on each path are controlled, and a decided path is notified to an inspection target person and a person in charge of an inspection.

Advantageous Effect

As described above, the inspection system 10 for deciding a path in which an inspection target person advances after the first inspection site, based on a result of a belongings inspection at the first inspection site, and guiding the inspection target person to the decided path can appropriately and efficiently guide the inspection target person to the path after the first inspection site. As a result, an operation at the first inspection site can be made more efficient, and a waiting time for an inspection at the first inspection site can be shortened.

Further, the inspection system capable of sorting an inspection target person into the secondary inspection performed at that place (second inspection site) and the secondary inspection performed later, depending on a type of a detection target object being detected, instead of performing the secondary inspection at that place on all inspection target persons from which a detection target object is detected, can reduce congestion of the secondary inspection at that place. As a result, a waiting time for an inspection at the second inspection site can be shortened.

Second Example Embodiment

An inspection system 10 according to the present example embodiment can dynamically change the first detection target object (see FIG. 5) described in the first example embodiment according to a situation. Details will be described below.

As described in the first example embodiment, a decision unit 13 decides that a secondary inspection is performed at a place, for an inspection target person from which the first detection target object is detected, and decides a path leading to a second inspection site. On the other hand, the decision unit 13 decides that the secondary inspection is performed later, for an inspection target person from which a detection target object that does not correspond to the first detection target object is detected, and decides a path different from a path leading to the secondary inspection, for example, a path leading to the inside of a facility.

Then, the decision unit 13 changes a detection target object included in the first detection target object according to a situation. The decision unit 13 can perform any of the following first to third changing processing.

—First Changing Processing—

In the processing, the decision unit 13 changes a detection target object included in the first detection target object according to a situation at the second inspection site.

The situation at the second inspection site includes at least one of a congestion situation of the secondary inspection performed at the second inspection site, the number of persons in charge of the secondary inspection performed at the second inspection site, and a skill of a person in charge of the secondary inspection performed at the second inspection site (a skill level of the secondary inspection).

For example, the first detection target object may be defined in advance for each congestion situation (for example: congested, slightly congested, normal, less crowded, least crowded) of the secondary inspection performed at the second inspection site, and may be stored in a storage unit 15. The decision unit 13 can determine the first detection target object according to the congestion situation of the secondary inspection performed at the second inspection site, based on the information indicating the definition. Note that, the definition is made in such a way that the number of detection target objects included in the first detection target object decreases as the secondary inspection performed at the second inspection site is more congested.

A means for determining a congestion situation of the secondary inspection performed at the second inspection site is not particularly limited. For example, a congestion situation may be determined based on the number of persons who are waiting for an inspection by analyzing an image in which the second inspection site is captured and counting the number.

In addition, the first detection target object may be defined in advance for each number of persons in charge of the secondary inspection performed at the second inspection site, and may be stored in the storage unit 15. The decision unit 13 can determine the first detection target object according to the number of persons in charge of the secondary inspection performed at the second inspection site, based on the information indicating the definition. Note that, the definition is made in such a way that the number of detection target objects included in the first detection target object decreases as the number of persons in charge decreases.

A means for determining the number of persons in charge of the secondary inspection performed at the second inspection site is not particularly limited. For example, the number of persons in charge may be counted by analyzing an image in which the second inspection site is captured. In addition, the number of persons in charge may be determined based on work shift information (information indicating a person in charge of the second inspection site for each date and time) registered in a server, information indicating a person who is working at a point in time of an input to a system installed at the second inspection site, and the like.

In addition, the first detection target object may be defined in advance for each skill of a person in charge of the secondary inspection performed at the second inspection site, and may be stored in the storage unit 15. The decision unit 13 determines the first detection target object according to a skill of a person in charge of the secondary inspection performed at the second inspection site, based on the information indicating the definition. Note that, the definition is made in such a way that the number of detection target objects included in the first detection target object increases as the number of persons in charge with a high skill increases.

A means for determining a skill of a person in charge of the secondary inspection performed at the second inspection site is not particularly limited. For example, a person in charge of the secondary inspection may be determined based on work shift information (information indicating a person in charge of the second inspection site for each date and time) registered in a server, information indicating a person who is working at a point in time of an input to a system installed at the second inspection site, and the like. Then, a skill of the person in charge of the secondary inspection may be determined by referring to a skill of each person in charge being registered in the server in advance.

Note that, herein, an example in which cases are classified by using each of a congestion situation of the secondary inspection performed at the second inspection site, the number of persons in charge of the secondary inspection performed at the second inspection site, and a skill of a person in charge of the secondary inspection performed at the second inspection site, and the first detection target object according to each case is defined in advance is described. In addition, cases may be classified by using a plurality of a congestion situation of the secondary inspection performed at the second inspection site, the number of persons in charge of the secondary inspection performed at the second inspection site, and a skill of a person in charge of the secondary inspection performed at the second inspection site, and the first detection target object according to each case may be defined in advance. As a case in this case, for example, "congested, six or more persons in charge", "congested, five or less persons in charge", or the like, and "congested, five or less persons in charge, presence of a person in charge at a skill level 5 or more", "congested, five or less persons in charge, absence of a person in charge at a skill level 5 or more", or the like are exemplified.

—Second Changing Processing—

In the processing, the decision unit 13 changes a detection target object included in the first detection target object according to at least one of a date and time, a day of a week, weather, a temperature, a congestion situation of a facility in which the inspection system 10 is installed, and a content of an event performed at the facility.

Cases are classified in advance by using at least one of the items, and the first detection target object according to each case is defined and stored in the storage unit 15. The decision unit 13 determines the first detection target object, based on the information about the definition.

For example, the definition is made in such a way that the number of detection target objects included in the first detection target object decreases for a case where a facility is congested. On the other hand, the definition is made in such a way that the number of detection target objects included in the first detection target object increases for a case where a facility is not crowded.

A means for determining a congestion situation of a facility in which the inspection system 10 is installed is not particularly limited. For example, the congestion situation may be determined by analyzing an image in which the inside of the facility is captured. Further, a means for determining a content of an event performed at a facility is also not particularly limited. For example, an operator may register the content in advance in the inspection system 10.

—Third Changing Processing—

In the processing, the decision unit 13 acquires attribute information about an inspection target person, and changes a detection target object included in the first detection target object, based on the attribute information. The attribute information is gender, age, and the like.

Cases are classified in advance by using at least one of the items, and the first detection target object according to each case is defined and stored in the storage unit 15. The decision unit 13 determines the first detection target object, based on the information about the definition.

The definition is made in such a way that the number of detection target objects included in the first detection target object decreases as a degree of urgency decreases such as a case where an inspection target person is a child.

A means for acquiring attribute information about an inspection target person is not particularly limited. For example, gender and age may be estimated by analyzing an image in which an inspection target person is captured. In addition, an input of identification information (such as face information, fingerprint information, voiceprint information, iris information, gait information, and a string of numbers and characters) about an inspection target person may be received via any input apparatus, and attribute information about the inspection target person associated with the acquired identification information may be acquired from a server. In the latter case, the identification information and the attribute information about the inspection target person need to be registered in advance in the server.

Another configuration of the inspection system 10 according to the present example embodiment is similar to that in the first example embodiment.

The inspection system 10 according to the present example embodiment achieves an advantageous effect similar to that in the first example embodiment. Further, the inspection system 10 according to the present example embodiment can dynamically change, according to a situation, a definition of the first detection target object (see FIG. 5) used for deciding whether to guide to the second inspection site where the secondary inspection is performed. Since a reference for guiding to the second inspection site can be dynamically changed according to a situation, congestion at the inspection site can be effectively reduced, and a waiting time for an inspection at the inspection site can be effectively shortened.

Third Example Embodiment

An inspection system 10 according to the present example embodiment includes a means for achieving a secondary inspection performed on an inspection target person decided that the secondary inspection is performed later.

Figure 7:
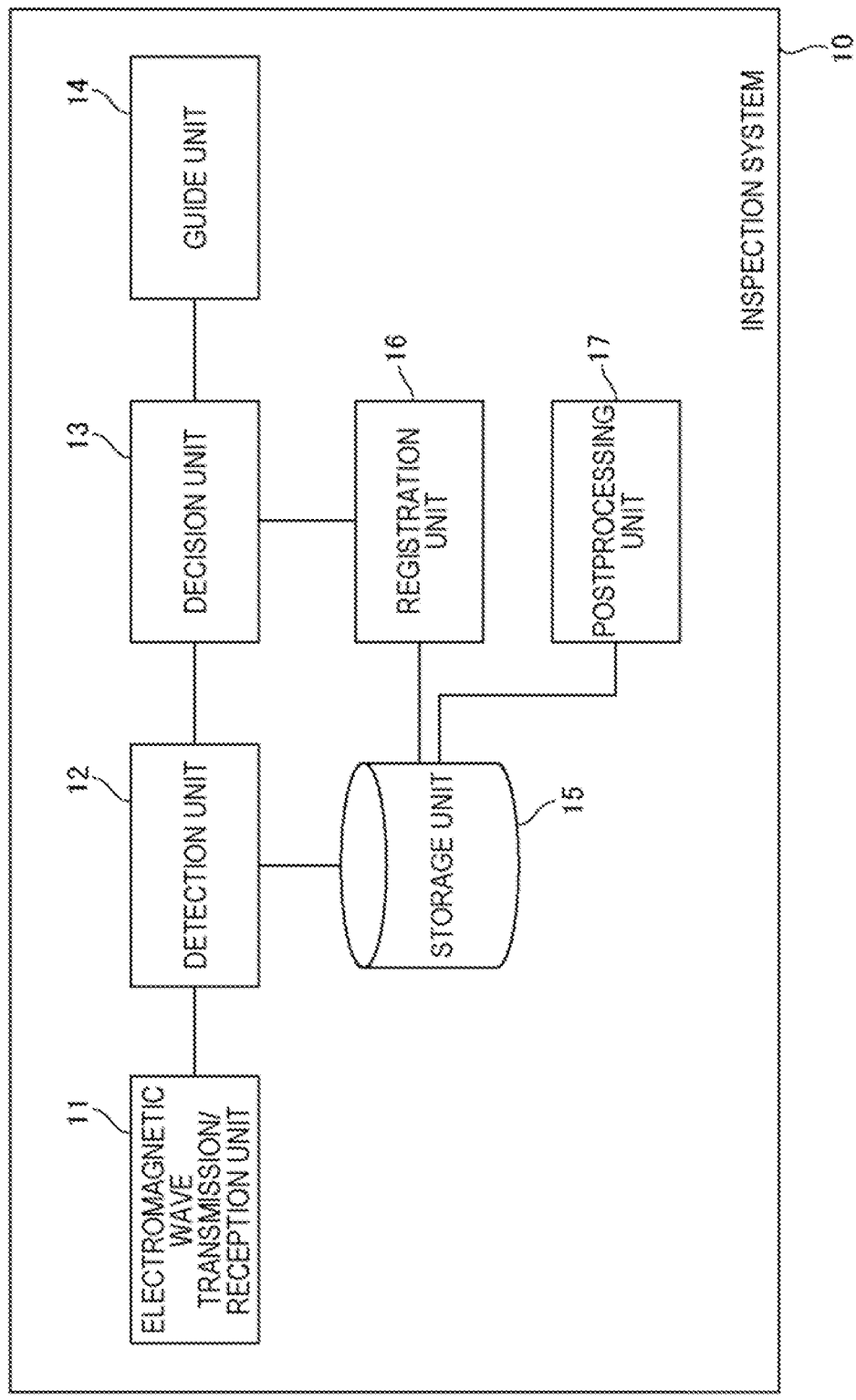
FIG. 7 is a diagram illustrating one example of a functional block diagram of the inspection system according to the present example embodiment.

FIG. 7 illustrates one example of a functional block diagram of the inspection system 10 according to the present example embodiment. As illustrated, the inspection system 10 includes an electromagnetic wave transmission/reception unit 11, a detection unit 12, a decision unit 13, a guide unit 14, a storage unit 15, a registration unit 16, and a postprocessing unit 17.

The registration unit 16 registers, in association with a result of detection, identification information about an inspection target person decided that the secondary inspection is performed later.

In the present example embodiment, a facility using the inspection system 10 includes a plurality of seats provided to a user. The plurality of seats are purchased in advance by a user. A seat purchased by a user A can be used only by the user A. Then, in the present example embodiment, identification information about the seat purchased by the user is used as "identification information about an inspection target person". In other words, the registration unit 16 registers, in association with a result of detection, identification information about a seat of an inspection target person decided that the secondary inspection is performed later.

At an inspection site, identification information about a seat (seat purchased by an inspection target person) provided to an inspection target person is input to the inspection system 10 by any means. For example, usage of an operation of reading a code (such as a bar code and a two-dimensional code) indicating identification information about a seat via a code reader, an operation of transmitting and receiving information by bringing a portable storage apparatus (such as a smartphone, a cellular phone, a smartwatch, an IC card, and an IC tag) that stores identification information about a seat into a short-range wireless communicable state with (close to) a reader, and the like is exemplified. In addition, an input of identification information (such as face information, fingerprint information, voiceprint information, iris information, gait information, and a string of numbers and characters) about an inspection target person may be received via any input apparatus, and identification information about a seat associated with the acquired identification information may be acquired from a server. In this case, the identification information about the inspection target person and the identification information about the seat need to be registered in advance in the server.

FIG. 8 schematically illustrates one example of information registered by the registration unit 16. The information is stored in the storage unit 15. In the illustrated example, identification information about a seat and a detection target object being detected are registered in association with each other.

Note that, in addition, an inspection target person may be captured at an inspection site. Then, the registration unit 16 may register an image generated by the capturing in association with identification information about an inspection target person decided that the secondary inspection is performed later.

The postprocessing unit 17 notifies a predetermined person in charge of identification information about a seat provided to an inspection target person decided that the secondary inspection is performed later. For example, the postprocessing unit 17 notifies a predetermined person in charge of a list as illustrated in FIG. 8. The person in charge goes to a seat on the list, and performs the secondary inspection on a person sitting in the seat. The secondary inspection may be performed in the seat, or may be performed after moving to another place.

Further, when an image of an inspection target person captured at an inspection site is registered, the postprocessing unit 17 may provide the image to a predetermined person in charge. The person in charge can confirm, based on the image, whether a person sitting in a seat is the same person as an inspection target person decided that the secondary inspection is performed later.

A means for providing the list and an image to a predetermined person in charge is not particularly limited. For example, the list and an image may be transmitted to a preregistered e-mail address, may be displayed on a predetermined screen after a login to an application or a system, or may be acquired by using a push notification function of an application.

Figure 9:
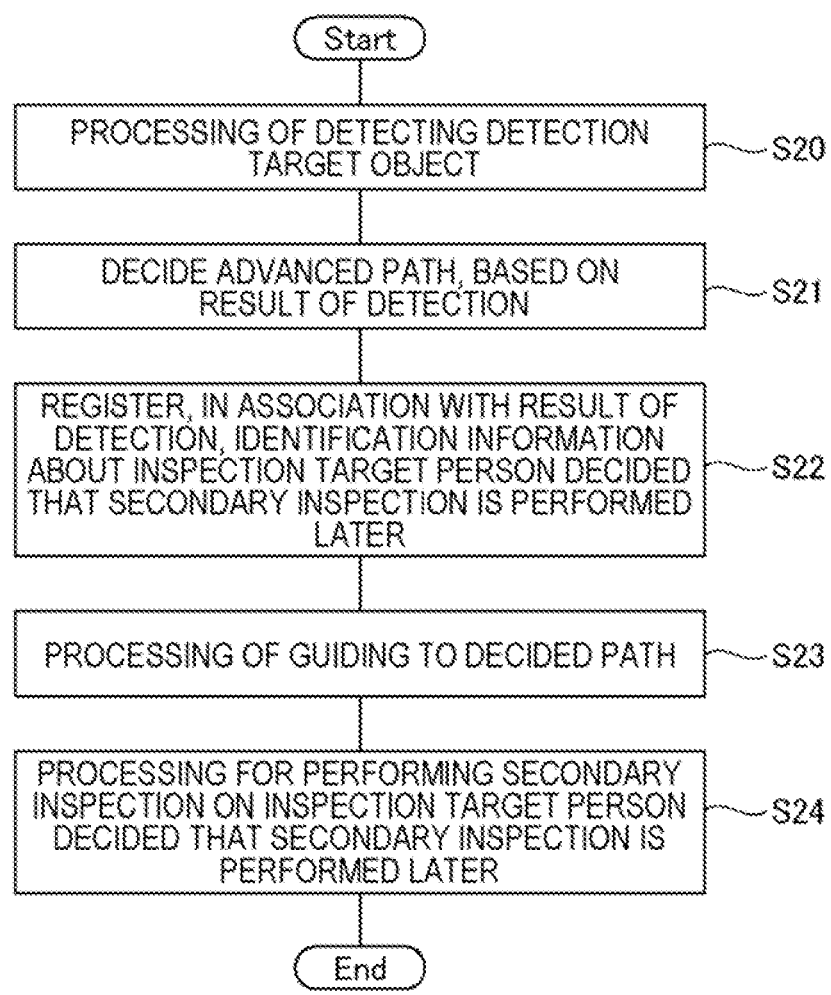
FIG. 9 is a flowchart illustrating one example of a flow of the processing of the inspection system according to the present example embodiment.

Next, one example of a flow of processing of the inspection system 10 will be described by using a flowchart in FIG. 9.

First, the inspection system 10 performs processing of detecting a detection target object from an inspection target person (S20).

Specifically, the inspection system 10 irradiates an inspection target person with an electromagnetic wave having a wavelength of equal to or more than 30 micrometers and equal to or less than one meter, and receives a reflection wave. Then, the inspection system 10 performs the processing of detecting a detection target object, based on a signal of the reflection wave.

Next, the inspection system 10 decides a path in which the inspection target person advances, based on a detection result in S20 (S21).

Specifically, for an inspection target person from which a detection target object is not detected, the inspection system 10 decides a path different from a path leading to the secondary inspection, for example, a path leading to the inside of a facility.

Further, for an inspection target person from which the first detection target object (see FIG. 5) being predefined is detected, the inspection system 10 decides that the secondary inspection is performed at that place, and decides a path leading to the second inspection site.

Further, for an inspection target person from which a detection target object different from the first detection target object (see FIG. 5) is detected, the inspection system 10 decides that the secondary inspection is performed later, and decides a path different from a path leading to the secondary inspection, for example, a path leading to the inside of a facility.

Next, the inspection system 10 registers, in association with the result of the detection in S20, identification information about the inspection target person decided in S21 that the secondary inspection is performed later (S22).

Specifically, the inspection system 10 acquires identification information about a seat provided to the inspection target person by any means. Then, the inspection system 10 registers, in association with the result of the detection in S20, the identification information about the seat.

Next, the inspection system 10 performs processing of guiding the inspection target person to the path decided in S21 (S22).

Specifically, opening and closing of a gate on each path are controlled, and a decided path is notified to an inspection target person and a person in charge of an inspection.

Subsequently, the inspection system 10 performs processing for performing the secondary inspection on the inspection target person decided that the secondary inspection is performed later (S24).

Specifically, the inspection system 10 notifies a predetermined person in charge of the identification information about the seat provided to the inspection target person decided that the secondary inspection is performed later.

Another configuration of the inspection system 10 according to the present example embodiment is similar to that in the first and second example embodiments. The inspection system 10 according to the present example embodiment achieves an advantageous effect similar to that in the first and second example embodiments. Further, the inspection system 10 according to the present example embodiment can register a detection result in advance in association with identification information about a seat provided to an inspection target person decided that the secondary inspection is performed later. Then, the inspection target person decided that the secondary inspection is performed later can be tracked based on the identification information about the seat, and the secondary inspection can be performed.

Fourth Example Embodiment

An inspection system 10 according to the present example embodiment includes a means for achieving a secondary inspection performed on an inspection target person decided that the secondary inspection is performed later, which is a means different from that in the third example embodiment.

FIG. 7 illustrates one example of a functional block diagram of the inspection system 10 according to the present example embodiment. As illustrated, the inspection system 10 includes an electromagnetic wave transmission/reception unit 11, a detection unit 12, a decision unit 13, a guide unit 14, a storage unit 15, a registration unit 16, and a postprocessing unit 17.

The registration unit 16 registers, in association with a result of detection, identification information about an inspection target person decided that the secondary inspection is performed later.

In the present example embodiment, "identification information about an inspection target person" associated with a result of detection is a feature value of an appearance of the inspection target person. An inspection target person is captured at an inspection site, and a feature value of an appearance of the inspection target person is extracted from an image generated by the capturing. As the feature value of the appearance, a feature value of a face, a feature value of a build, a feature value of clothing, and the like are exemplified, which are not limited thereto.

FIG. 10 schematically illustrates one example of information registered by the registration unit 16. The information is stored in the storage unit 15. In the illustrated example, a feature value of an appearance of an inspection target person and a detection target object being detected are registered in association with each other. Note that, as illustrated, an image generated by capturing an inspection target person at an inspection site may be registered in association with identification information about an inspection target person decided that the secondary inspection is performed later.

The postprocessing unit 17 detects an inspection target person from an image generated by a capturing apparatus that captures the inside of a facility, based on a feature value of an appearance of an inspection target person decided that the secondary inspection is performed later. Then, the postprocessing unit 17 notifies a predetermined person in charge of a location in which the inspection target person is detected. At a time of the notification, an image (at least one of the image captured in the facility and an image captured at an inspection site) of the detected inspection target person may be provided to the predetermined person in charge.

A means for achieving a notification to a predetermined person in charge is not particularly limited. For example, the notification may be transmitted to a preregistered e-mail address, may be displayed on a predetermined screen after a login to an application or a system, or may be acquired by using a push notification function of an application.

Herein, a means for determining a location in which an inspection target person is detected will be described.

For example, an installation location and a capturing direction of the capturing apparatus may be fixed. Then, information indicating a capturing area (such as an "area A of a seat on a second floor", a "room B", and "in front of a bathroom on a third floor") of the capturing apparatus may be stored in advance in the storage unit 15. In this case, the postprocessing unit 17 determines, as a location in which an inspection target person is detected, a capturing area of the capturing apparatus that generates an image in which the inspection target person is detected.

In addition, a feature value of an appearance of a landmark being a guideline for each of a plurality of locations in a facility may be stored in advance in the storage unit 15. In this case, the postprocessing unit 17 detects the landmark from an image in which an inspection target person is detected, and determines, as a location in which the inspection target person is detected, an installation location of the detected landmark. In this case, the capturing apparatus may capture the inside of the facility while moving in the facility by any movement means. Further, a capturing direction of the capturing apparatus may be changed by any mechanism.

A person in charge who receives the notification goes to a notified location, and finds the inspection target person decided that the secondary inspection is performed later. Then, the person in charge performs the secondary inspection on the found inspection target person. The secondary inspection may be performed in the seat, or may be performed after moving to another place.

Next, one example of a flow of processing of the inspection system 10 will be described by using the flowchart in FIG. 9.

First, the inspection system 10 performs processing of detecting a detection target object from an inspection target person (S20).

Specifically, the inspection system 10 irradiates an inspection target person with an electromagnetic wave having a wavelength of equal to or more than 30 micrometers and equal to or less than one meter, and receives a reflection wave. Then, the inspection system 10 performs the processing of detecting a detection target object, based on a signal of the reflection wave.

Next, the inspection system 10 decides a path in which the inspection target person advances, based on a detection result in S20 (S21).

Specifically, for an inspection target person from which a detection target object is not detected, the inspection system 10 decides a path different from a path leading to the secondary inspection, for example, a path leading to the inside of a facility.

Further, for an inspection target person from which the first detection target object (see FIG. 5) being predefined is detected, the inspection system 10 decides that the secondary inspection is performed at that place, and decides a path leading to the second inspection site.

Further, for an inspection target person from which a detection target object different from the first detection target object (see FIG. 5) is detected, the inspection system 10 decides that the secondary inspection is performed later, and decides a path different from a path leading to the secondary inspection, for example, a path leading to the inside of a facility.

Next, the inspection system 10 registers, in association with the result of the detection in S20, identification information about the inspection target person decided in S21 that the secondary inspection is performed later (S22).

Specifically, the inspection target person decided that the secondary inspection is performed later is captured at the inspection site, and an image is generated. The inspection system 10 analyzes the image, and extracts a feature value of an appearance of the inspection target person decided that the secondary inspection is performed later. Then, the inspection system 10 registers, in association with the result of the detection in S20, the feature value of the appearance of the inspection target person.

Next, the inspection system 10 performs processing of guiding the inspection target person to the path decided in S21 (S22).

Specifically, opening and closing of a gate on each path are controlled, and a decided path is notified to an inspection target person and a person in charge of an inspection.

Subsequently, the inspection system 10 performs processing for performing the secondary inspection on the inspection target person decided that the secondary inspection is performed later (S24).

Specifically, the inspection system 10 detects the inspection target person decided that the secondary inspection is performed later from an image generated by a capturing apparatus that captures the inside of a facility, based on the feature value of the appearance of the inspection target person decided that the secondary inspection is performed later, and notifies a predetermined person in charge of a detected location.

Another configuration of the inspection system 10 according to the present example embodiment is similar to that in the first and second example embodiments. The inspection system 10 according to the present example embodiment achieves an advantageous effect similar to that in the first and second example embodiments. Further, the inspection system 10 according to the present example embodiment can register a detection result in advance in association with a feature value of an appearance of an inspection target person decided that the secondary inspection is performed later. Then, the inspection target person decided that the secondary inspection is performed later can be tracked based on the feature value of the appearance, and the secondary inspection can be performed.

MODIFICATION EXAMPLE

First Modification Example

In the example embodiments described above, two paths after the first inspection site are prepared in advance, and a subsequent path is decided for each inspection target person according to a detection result at the first inspection site. As a modification example, three or more paths after the first inspection site may be prepared in advance, and a subsequent path may be decided for each inspection target person according to a detection result (whether a detection target object is detected, a type of a detection target object being detected, or the like) at the first inspection site.

Second Modification Example

The abnormal state in the example embodiments described above is a state where a person present in a predetermined region carries a preset detection target object. Then, the detection unit 12 detects, from a signal of a reflection wave, abnormal data (a feature value of a detection target object) that are not preferable to be included in the signal of the reflection wave.

In the modification example, the detection unit 12 performs detection processing of referring normal data that are preferable to be included, and detecting an abnormal state (a state different from a state indicated by the normal data) from a signal of a reflection wave. Then, the decision unit 13 decides whether to perform the secondary inspection at that place or perform the secondary inspection later, based on a content of the detected abnormal state.

Third Modification Example

In the example embodiments described above, a target object prohibited from being brought is set as a detection target object. Then, a state where a person present in a predetermined region carries a preset detection target object is detected as an abnormal state. In the modification example, a target object needed to be carried by a user is set as a detection target object. For example, a badge of a police officer, an object required to be carried by a person who participates in an event, and the like are a detection target object in the modification example. Then, in the modification example, a state where a person present in a predetermined region does not carry a preset detection target object is detected as an abnormal state. In this case, whether to perform the secondary inspection at that place or perform the secondary inspection later may be decided based on an attribute of a user from which the abnormal state is detected. The attribute of a user may be an attribute estimated from an image, such as gender and age, or may be another attribute.

Note that, a target object prohibited from being brought may be set as a detection target object A, and a target object needed to be carried by a user may be set as a detection target object B. In this case, a detection result is classified into a plurality of cases, such as a "case where the detection target object A is detected and the detection target object B is not detected", a "case where the detection target object B is detected and the detection target object A is not detected", a "case where both of the detection target object A and the detection target object B are detected", and a "case where both of the detection target object A and the detection target object B are not detected". Which case is detected as the abnormal state is a design matter.

An advantageous effect similar to that in the example embodiments described above is also achieved in the modification examples.

Note that, in the present specification, "acquisition" includes at least any one of "acquisition of data stored in another apparatus or a storage medium by its own apparatus (active acquisition)", based on a user input or an instruction of a program, such as reception by making a request or an inquiry to another apparatus and reading by accessing to another apparatus or a storage medium, "inputting of data output to its own apparatus from another apparatus (passive acquisition)", based on a user input or an instruction of a program, such as reception of data to be distributed (transmitted, push-notified, or the like) and acquisition by selection from among received data or received information, and "generation of new data by editing data (such as texting, sorting of data, extraction of a part of data, and change of a file format) and the like, and acquisition of the new data".

A part or the whole of the above-described example embodiment may also be described in supplementary notes below, which is not limited thereto.

1. An inspection system, including:
    an electromagnetic wave transmission/reception means for irradiating an electromagnetic wave having a wavelength of equal to or more than 30 micrometers and equal to or less than one meter, and receiving a reflection wave;
    a detection means for performing detection processing, based on a signal of the reflection wave;
    a decision means for deciding a path in which an inspection target person advances, based on a result of the detection processing; and
    a guide means for performing processing of guiding the inspection target person to a decided path.
2. The inspection system according to supplementary note 1, wherein
    the detection means detects a detection target object, based on a signal of the reflection wave, and
    the decision means decides a path in which the inspection target person advances, based on a result of processing of detecting the detection target object.
3. The inspection system according to supplementary note 2, wherein
    the decision means
        decides a first path for the inspection target person from which a first detection target object being predetermined is detected, and
        decides another path for the inspection target person from which the first detection target object is not detected.
4. The inspection system according to supplementary note 3, wherein
    the decision means changes the detection target object included in the first detection target object according to a situation of an inspection site ahead on the first path.

5. The inspection system according to supplementary note 4, wherein
the decision means changes the detection target object included in the first detection target object according to at least one of a congestion situation at the inspection site, a number of persons present at the inspection site, and a skill of a person in charge present at the inspection site.

6. The inspection system according to any one of supplementary notes 2 to 5, wherein
the decision means changes the detection target object included in the first detection target object according to at least one of a date and time, a day of a week, weather, a temperature, a congestion situation of a facility, and a content of an event performed at a facility.

7. The inspection system according to any one of supplementary notes 2 to 6, wherein
the decision means acquires attribute information about the inspection target person, and changes the detection target object included in the first detection target object, based on the attribute information.

8. The inspection system according to any one of supplementary notes 1 to 7, wherein
the guide means performs processing of notifying a predetermined person of a path in which the inspection target person advances.

9. The inspection system according to any one of supplementary notes 1 to 8, wherein
the guide means performs processing of opening a gate on a path in which the inspection target person advances.

10. An inspection method, including:
by a computer,
irradiating an electromagnetic wave having a wavelength of equal to or more than 30 micrometers and equal to or less than one meter, and receiving a reflection wave;
performing detection processing, based on a signal of the reflection wave;
deciding a path in which an inspection target person advances, based on a result of the detection processing; and
performing processing of guiding the inspection target person to a decided path.

10 Inspection system
11 Electromagnetic wave transmission/reception unit
12 Detection unit
13 Decision unit
14 Guide unit
15 Storage unit
16 Registration unit
17 Postprocessing unit
1A Processor
2A Memory
3A Input/output interface (I/F)
4A Peripheral circuit
5A Bus

The invention claimed is:

1. An inspection system, comprising:
at least one memory configured to store one or more instructions; and
at least one processor configured to execute the one or more instructions to:
controlling an antenna of the inspection system to irradiate an electromagnetic wave to an inspection target person, the electromagnetic wave having a wavelength of equal to or more than 30 micrometers and equal to or less than one meter;
detecting, by a sensor of the inspection system, a reflection wave of the electromagnetic wave irradiated to the inspection target person;
perform detection processing comprising detecting a feature value of a signal of the reflection wave of the electromagnetic wave irradiated to the inspection target person and detected by the sensor; and
decide a path in which the inspection target person advances, based on a result of the detection processing comprising detecting the feature value of the signal of the reflection wave of the electromagnetic wave irradiated to the inspection target person by the antenna and detected by the sensor; and
perform processing of guiding the inspection target person to the path by controlling at least one of a plurality of gates to open based on detecting the feature value of the signal of the reflection wave of the electromagnetic wave irradiated to the inspection target person by the antenna and detected by the sensor.

2. The inspection system according to claim 1, wherein the processor is further configured to execute the one or more instructions to:
detect a detection target object, based on another feature values of another signal of the reflection wave, and
decide the path in which the inspection target person advances further based on a result of processing of detecting the detection target object.

3. The inspection system according to claim 2, wherein the processor is further configured to execute the one or more instructions to:
decide a first path for the inspection target person from which a first detection target object being predetermined is detected, and
decide another path for the inspection target person from which the first detection target object is not detected.

4. The inspection system according to claim 3, wherein the processor is further configured to execute the one or more instructions to change the detection target object included in the first detection target object according to a situation of an inspection site ahead on the first path.

5. The inspection system according to claim 4, wherein the processor is further configured to execute the one or more instructions to change the detection target object included in the first detection target object according to at least one of a congestion situation at the inspection site, a number of persons present at the inspection site, and a skill of a person in charge present at the inspection site.

6. The inspection system according to claim 2, wherein the processor is further configured to execute the one or more instructions to change the detection target object included in the first detection target object according to at least one of a date and time, a day of a week, weather, a temperature, a congestion situation of a facility, and a content of an event performed at a facility.

7. The inspection system according to claim 2, wherein the processor is further configured to execute the one or more instructions to acquire attribute information about the inspection target person, and change the detection target object included in the first detection target object, based on the attribute information.

8. The inspection system according to claim 1, wherein the processor is further configured to execute the one or more instructions to perform processing of notifying a predetermined person of the path in which the inspection target person advances.

9. The inspection system according to claim 1, wherein the gate is along the path.

10. The inspection system according to claim 1, wherein the at least one processor is further configured to execute the one or more instructions to decide ones of a plurality of paths, including the path, for ones of a plurality of inspection target persons, including the inspection target person, based on ones of results of a plurality of detection processing, including the detection processing, for respective ones the plurality of inspection target persons.

11. The inspection system according to claim 1, wherein the at least one processor is further configured to execute the one or more instructions to:
    detect whether a first detection target object is detected from the inspection target person based on the signal of the reflection wave of the electromagnetic wave irradiated to the inspection target person by the antenna and detected by the sensor;
    decide the path based on whether the path is to an inspection cite such that the inspection target person is directed to the inspection cite depending on detection of the first detection object; and
    change the first detection target object based on at least one of a congestion situation at the inspection site, a number of persons in charge at the inspection site, and a skill of a person, of the persons, in charge present at the inspection site, a date and time, a day of a week, weather, a temperature, a congestion situation of a facility, and a content of an event performed at a facility, and attribute information about the inspection target person.

12. The inspection system according to claim 1, wherein the at least one processor is further configured to execute the one or more instructions to:
    detect whether a first detection target object is detected from the inspection target person based on the signal of the reflection wave of the electromagnetic wave irradiated to the inspection target person by the antenna and detected by the sensor;
    decide the path based on whether the path is to an inspection cite such that the inspection target person is not led to the inspection cite based on detecting a second detection object, rather than the first detection object, based on the signal of the reflection wave of the electromagnetic wave irradiated to the inspection target person by the antenna and detected by the sensor; and
    register an information identifying the inspection target person.

13. An inspection method, comprising:
by a computer,
    controlling an antenna to irradiate an electromagnetic wave to an inspection target person, the electromagnetic wave having a wavelength of equal to or more than 30 micrometers and equal to or less than one meter;
    detecting, by a sensor, a reflection wave of the electromagnetic wave irradiated to the inspection target person;
    performing detection processing comprising detecting a feature value of a signal of the reflection wave of the electromagnetic wave irradiated to the inspection target person and detected by the sensor; and
    deciding a path in which the inspection target person advances, based on a result of the detection processing comprising detecting the feature value of the signal of the reflection wave of the electromagnetic wave irradiated to the inspection target by the antenna and detected by the sensor; and
    performing processing of guiding the inspection target person to the path by controlling at least one of a plurality of gates to open based on detecting the feature value of the signal of the reflection wave of the electromagnetic wave irradiated to the inspection target person by the antenna and detected by the sensor.

* * * * *